United States Patent
Last et al.

(10) Patent No.: US 11,088,127 B2
(45) Date of Patent: *Aug. 10, 2021

(54) MULTICHANNEL MONOSTATIC RANGEFINDER

(71) Applicant: Waymo LLC, Mountain View, CA (US)

(72) Inventors: Matthew Last, San Jose, CA (US); Ajaya Chilumula, Palo Alto, CA (US)

(73) Assignee: Waymo LLC, Mountain View, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/878,821

(22) Filed: May 20, 2020

(65) Prior Publication Data
US 2020/0279839 A1    Sep. 3, 2020

Related U.S. Application Data

(63) Continuation of application No. 16/154,871, filed on Oct. 9, 2018, now Pat. No. 10,707,195.

(51) Int. Cl.
*H01L 25/16*    (2006.01)
*G01S 7/481*    (2006.01)
(Continued)

(52) U.S. Cl.
CPC .......... *H01L 25/167* (2013.01); *G01S 7/4813* (2013.01); *H01L 31/02005* (2013.01); *H01S 5/0237* (2021.01); *H01S 5/02253* (2021.01)

(58) Field of Classification Search
CPC ............. H01L 25/167; H01L 31/02005; H01S 7/4813; H01S 5/02272; H01S 5/02288
See application file for complete search history.

(56) References Cited

U.S. PATENT DOCUMENTS

| 5,726,443 A | 3/1998 | Immega et al. |
| 9,065,239 B2 | 6/2015 | Joseph et al. |

(Continued)

FOREIGN PATENT DOCUMENTS

| EP | 3176601 | 6/2017 |
| WO | 2016/116733 | 7/2016 |

OTHER PUBLICATIONS

International Searching Authority, International Search Report and Written Opinion dated Dec. 23, 2019, issued in connection with International Patent Application No. PCT/US2019/050419, filed on Sep. 10, 2019, 9 pages.

*Primary Examiner* — Thanh Luu (74) *Attorney, Agent, or Firm* — McDonnell Boehnen Hulbert & Berghoff LLP (57) ABSTRACT

The present disclosure relates to optical systems and methods for their manufacture. An example optical system includes a first substrate having a mounting surface and a spacer structure having at least one cavity. The spacer structure is coupled to the mounting surface of the first substrate. The optical system also includes a light-emitter device that is coupled to the spacer structure and a detector device coupled to the first substrate such that the at least one detector device is disposed within the at least one cavity of the spacer structure. The optical system also includes a second substrate that mounts a lens and a waveguide and is coupled to the spacer structure. The optical system also includes a shim coupled between the second surface of the spacer structure and a mounting surface of the second substrate.

19 Claims, 10 Drawing Sheets

(51) Int. Cl.
*H01L 31/02* (2006.01)
*H01S 5/0237* (2021.01)
*H01S 5/02253* (2021.01)

(56) References Cited

U.S. PATENT DOCUMENTS

| | | |
|---|---|---|
| 9,705,283 B1 | 7/2017 | Deppe et al. |
| 10,707,195 B2 * | 7/2020 | Last ..................... G01S 7/4813 |
| 2008/0063342 A1 | 3/2008 | Ono et al. |
| 2011/0255303 A1 | 10/2011 | Nichol et al. |
| 2013/0215922 A1 | 8/2013 | Shimizu et al. |
| 2013/0334445 A1 | 12/2013 | Tharumalingam et al. |
| 2016/0084761 A1 | 3/2016 | Rothberg et al. |
| 2016/0146639 A1 | 5/2016 | Chan |
| 2017/0108672 A1 * | 4/2017 | Chang ..................... G02B 7/02 |
| 2017/0287963 A1 | 10/2017 | Rudmann et al. |

* cited by examiner

MULTICHANNEL MONOSTATIC RANGEFINDER

CROSS-REFERENCE TO RELATED APPLICATION

The present application is a continuation of U.S. patent application Ser. No. 16/154,871, filed Oct. 9, 2018, the content of which is herewith incorporated by reference.

BACKGROUND

Optical systems may include several elements, such as light sources, optical elements, and/or photodetectors disposed within a common package.

SUMMARY

In a first aspect, an optical system is provided. The optical system includes a first substrate. The first substrate includes a mounting surface. The optical system also includes a spacer structure having a first surface and a second surface, opposite the first surface. The spacer structure includes at least one cavity. The first surface of the spacer structure is coupled to the mounting surface of the first substrate. The optical system additionally includes at least one light-emitter device that is coupled to the second surface of the spacer structure. The optical system further includes at least one detector device that is coupled to the mounting surface of the first substrate such that the at least one detector device is disposed within the at least one cavity of the spacer structure. The optical system also includes a second substrate having a mounting surface. The mounting surface of the second substrate is coupled to the second surface of the spacer structure. The optical system includes a shim coupled between the second surface of the spacer structure and the mounting surface of the second substrate. The optical system additionally includes at least one lens coupled to the mounting surface of the second substrate and at least one waveguide coupled to the mounting surface of the second substrate.

In a second aspect, a method is provided. The method includes forming at least one cavity in a spacer structure. The spacer structure includes a first surface and a second surface opposite the first surface. The method also includes coupling at least one detector device to a mounting surface of a first substrate and coupling the mounting surface of the first substrate to the first surface of the spacer structure such that the at least one detector device is disposed within the at least one cavity of the spacer structure. The method additionally includes coupling at least one light-emitter device to the second surface of the spacer structure. The method further includes determining a step height between a surface of the at least one light-emitter device and the second surface of the spacer structure. The method yet further includes selecting a shim based on the determined step height. The method includes coupling at least one lens and at least one waveguide to a mounting surface of a second substrate and coupling the mounting surface of the second substrate to the second surface of the spacer structure by way of the selected shim.

DETAILED DESCRIPTION

Example methods, devices, and systems are described herein. It should be understood that the words "example" and "exemplary" are used herein to mean "serving as an example, instance, or illustration." Any embodiment or feature described herein as being an "example" or "exemplary" is not necessarily to be construed as preferred or advantageous over other embodiments or features. Other embodiments can be utilized, and other changes can be made, without departing from the scope of the subject matter presented herein.

Thus, the example embodiments described herein are not meant to be limiting. Aspects of the present disclosure, as generally described herein, and illustrated in the figures, can be arranged, substituted, combined, separated, and designed in a wide variety of different configurations, all of which are contemplated herein.

Further, unless context suggests otherwise, the features illustrated in each of the figures may be used in combination with one another. Thus, the figures should be generally viewed as component aspects of one or more overall embodiments, with the understanding that not all illustrated features are necessary for each embodiment.

I. Overview

In example embodiments, an optical system package could include several elements including: a laser diode, one or more waveguides that convey the light from the laser diode to one or more emission regions, an optical element or feature that collects the light from the laser and couples it into the waveguide, a mirror or other feature that redirects the light in the waveguide towards an emission direction, a light-sensitive receiver chip, and a pinhole that restricts the acceptance angle of light arriving at the light-sensitive receiver chip.

Such an optical system package could be utilized as part of a light detection and ranging (LIDAR) system. For example, the optical system package could form a compact, modular LIDAR system that could be used in machine vision and/or perception applications. In some embodiments, the optical system package could be used in LIDAR systems for semi- or fully-autonomous vehicles.

Specifically, an optical system could include a substrate with embedded electrical traces. In some embodiments, the substrate could include a multilayer organic (MLO) substrate, which could include, for example, one or more RF dielectric layers embedded between layers of other laminates to provide routing, shielding and bonding pads for placement of surface-mount components. Other substrate materials (e.g., FR4) and types (e.g., printed circuit board (PCB)) are possible and contemplated herein.

A bottom surface of the substrate could include an electrical and mechanical interface to an underlying circuit board. In some embodiments, the electrical and mechanical interface could include a plurality of controlled-collapse solder balls that could serve to electrically couple the substrate to the circuit board and maintain a controllable spacing between the two surfaces.

The optical system also includes a spacer structure. The spacer structure could include a plurality of plated through-holes and could be bonded to a top surface of the substrate. The spacer structure may include a plurality of cavities, each cavity being an opening that passes between the two major surfaces of the spacer structure. In some embodiments, the spacer structure could be die-punched and coated with a black copper material. Other coatings are contemplated and possible.

The optical system includes a plurality of photodetector devices, which could include silicon photomultipliers (SiPMs), avalanche photodiodes (APDs), or other types of photodetectors. Other embodiments could include silicon or other semiconductor PIN or PN photodiodes, SPAD arrays, or other high-speed photodetectors. In an example embodiment, 4 or 16 SiPM detector chips (or a different number of detector chips) could be flip-chip bonded to the top surface of the substrate. The photodetector devices could be disposed on the top surface of the substrate so as to be within a cavity of the spacer structure when the spacer structure is bonded to the top surface of the substrate. In an alternative embodiment, the photodetector devices could be situated adjacent to the spacer structure when bonded to the top surface of the substrate.

The optical system also includes an intermediate lid. The intermediate lid may be coupled (e.g., bonded with epoxy or another adhesive material) to a top surface of the spacer structure. The intermediate lid may include apertures and optically-opaque baffles that are registered to the cavities of the spacer structure and/or the underlying photodetectors. In some embodiments, the intermediate lid could be configured to prevent light from leaking between adjacent cavities in the spacer structure as well as between adjacent photodetector devices.

The optical system further includes one or more light-emitter devices that are coupled to the top surface of the spacer structure. For example, the light-emitter devices could include edge-emitting laser diodes. It will be understood that other types of light-emitter devices, such as vertical cavity emitting lasers (e.g., VCSELs), light-emitting diodes (LEDs), etc. are contemplated and possible within the scope of the present disclosure. The light-emitter devices could be coupled to the spacer structure with conductive epoxy and/or high-temperature solder. Additionally or alternatively, the light-emitter devices could be wire-bonded to conductive pads on the top surface of the spacer structure.

The optical system also includes a second substrate that functions as a top lid. The top lid could be formed from a transparent material, such as glass, plastic, fused silica, or another transparent low-refractive index material. A top surface of the top lid could include an antireflective coating. Furthermore, during assembly, the top surface (and/or the antireflective coating) could be protected during assembly with a removable polymer film (e.g., Kapton or polyimide). Optionally, an antireflective coating could be applied to a bottom surface of the top lid.

The top lid could also include a plurality of waveguides coupled to the bottom surface of the top lid. In some embodiments, the waveguides could be configured to guide light emitted by the light-emitter devices using total or partial internal reflection. At least some of the waveguides could include mirror surfaces configured to redirect the guided light out of plane and toward an external environment.

In some embodiments, the top lid could include a cylindrical rod lens configured to act as a fast-axis collimation lens that could couple light from the light-emitter devices and direct at least a portion of the light toward the waveguides.

The optical system includes a shim (e.g., a shim ring) that is coupled between the top lid and the spacer substrate. The shim could have a controlled thickness and could serve as a bonding interface between the top lid and the spacer substrate. Additionally or alternatively, the shim could be configured to prevent light from leaking through the edge of the glass substrate. In some embodiments, the shim could be a polymer material that cures or molds around the top lid. In such a scenario, the shim could hold the top lid at a fixed height and/or location relative to the spacer substrate and other elements of the optical system.

In some embodiments, the thickness (e.g., distance between top and bottom surfaces) of the shim is selected such that respective emission regions of the light-emitter devices (e.g., the laser diodes) are aligned to the waveguide and other optical components. Furthermore, in some examples, a diameter and/or thickness of the cylindrical rod lens is selected to maximize light coupling from the light-emitter devices into respective waveguides.

In some examples, the top lid could be fixed to the shim, intermediate lid, spacer structure, and/or the substrate with an adhesive, such as an epoxy. Other types of adhesives, such as adhesive films, tape, or glues are possible and contemplated within the context of the present disclosure.

Furthermore, in some scenarios, the photodetectors (e.g., the SiPM chips) could include narrow-band optical filters on or beneath their respective top surfaces. Additionally or alternatively, in other embodiments, the pinhole may have a narrow-band filter situated on or behind it.

In some embodiments, electrical signals are coupled into and out of the optical system package through solder balls disposed on a bottom surface of the optical system package. Some embodiments can include controlling a final height of the solder connection using controlled-collapse solder balls such as plastic core, high melting point alloy. Other methods to maintain a controlled gap between two surfaces, such as plastic, glass, or metal spacer balls or shims either on their own or contained within the conductive material are possible and contemplated. Other methods of conveying electrical signals include solder pads without solder balls, conductive adhesive, and/or solderable legs.

In some cases, electrical circuitry for providing a modulated signal to the laser diode is located within the package. Such circuit elements can include a Gallium Nitride FET (GaNFET) switch and a charge storage device such as a ceramic capacitor or reverse-biased transistor. In some embodiments, the modulated signal could cause the laser diode to emit laser light pulses, pulse trains, frequency-modulated continuous-wave laser light, or laser light according to other modulation formats.

In embodiments, a conductive shield is placed around at least a portion of the optical system package chip to minimize the opportunity for undesired electrical signals to couple into the receiver circuitry. Furthermore, an acceptance angle of the pinhole and receiver combination could be matched to a numerical aperture of an external lens. Additionally or alternatively, an emission angle of the laser, coupling element, waveguide, and mirror could be matched to the numerical aperture of the external lens.

Other aspects, embodiments, and implementations will become apparent to those of ordinary skill in the art by reading the following detailed description, with reference where appropriate to the accompanying drawings.

II. Example Systems

Figure 1:
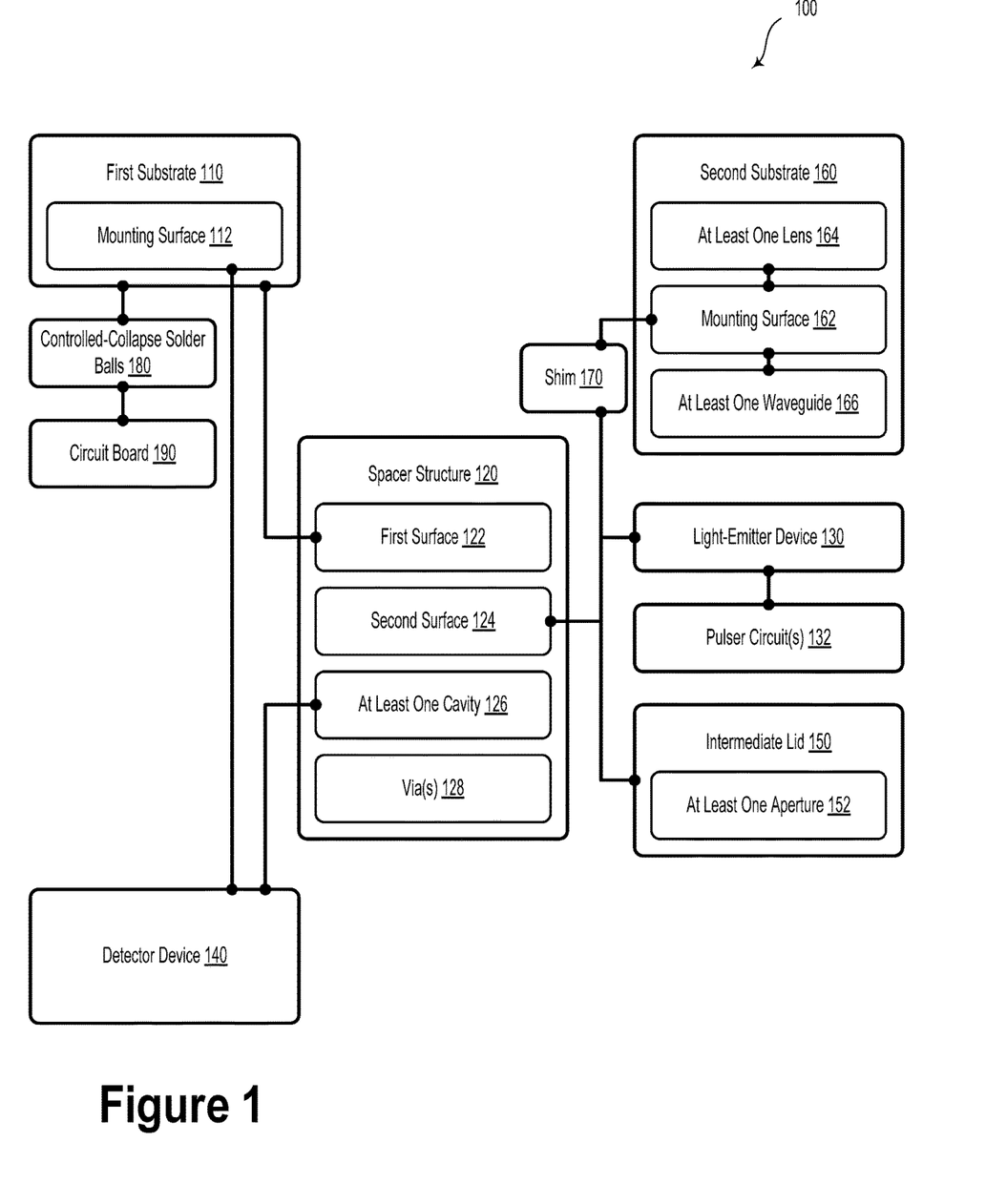
FIG. 1 illustrates a schematic block representation of an optical system, according to an example embodiment.

FIG. 1 illustrates a schematic block representation of an optical system 100, according to an example embodiment. In some cases, optical system 100 could be utilized as a compact LIDAR system, or a portion thereof. Such LIDAR systems may be configured to provide information (e.g., point cloud data) about one or more objects (e.g., location, shape, etc.) in a given environment. In an example embodiment, the LIDAR system could provide point cloud information, object information, mapping information, or other information to a vehicle. The vehicle could be a semi- or fully-automated vehicle. For instance, the vehicle could be a self-driving car, an autonomous drone aircraft, an autonomous truck, or an autonomous robot. Other types of vehicles and LIDAR systems are contemplated herein.

The optical system 100 includes a first substrate 110, which includes a mounting surface 112. In some examples, the first substrate 110 could be approximately 200 microns thick. For instance, the first substrate 110 could have a thickness of between 100 to 500 microns. However, other thicknesses are possible and contemplated. In some embodiments, the first substrate 110 could be a printed circuit board (PCB). In some other embodiments, the first substrate 110 could include a semiconductor substrate material such as silicon, gallium arsenide, or the like. In some embodiments, the first substrate 110 could include a silicon-on-insulator (SOI) material. Alternatively, the first substrate 110 could be formed from a variety of other solid and/or flexible materials, each of which is contemplated in the present disclosure.

The optical system 100 also includes a spacer structure 120. The spacer structure 120 includes a first surface 122 that has an opening that forms at least one cavity 126 in the spacer structure 120. The spacer structure 120 also includes a second surface 124, opposite the first surface 122, that has an opening forming the at least one cavity 126. The first surface 122 of the spacer structure 120 is coupled to the first substrate 110, and in some examples, directly to the mounting surface 112 of the first substrate 110.

As described elsewhere herein, the at least one cavity 126 could be formed in the spacer structure 120 by utilizing a lithographically-defined wet or dry etch process. Other semiconductor manufacturing techniques to form the at least one cavity 126 are possible and contemplated.

In some embodiments, the spacer structure 120 could include one or more electrical vias 128 that could electrically connect (not shown), for example, structures coupled to the first surface 122 (e.g., circuit board 190) to those coupled to the second surface 124 (e.g., light-emitter device 130).

The optical system 100 additionally includes at least one light-emitter device 130. The at least one light-emitter device 130 is coupled to the second surface 124 of the spacer structure 120. The at least one light-emitter device 130 could be configured to provide light pulses having at least one infrared wavelength (e.g., 905 nm). Other wavelengths and wavelength ranges are possible and contemplated. The at least one light-emitter device 130 could each include one or more laser bars or another type of light-emitting structure. In some embodiments, the light-emitter device 130 could include an InGaAs/GaAs laser diode, however other material systems are possible.

The optical system 100 yet further includes at least one detector device 140. The at least one detector device 140 is coupled to the mounting surface 112 of the first substrate 110. In some embodiments, the at least one detector device 140 is disposed within the at least one cavity 126 of the spacer structure 120. In examples, the at least one detector device 140 could be a silicon photomultiplier (SiPM), an avalanche photodiode (APD), or another type of photodetector.

The optical system 100 also includes an intermediate lid 150 that is coupled to the second surface 124 of the spacer structure 120. The intermediate lid includes at least one aperture 152 that defines an optical path to the at least one detector device 140 through the at least one cavity 126 of the spacer structure 120.

The optical system 100 additionally includes a second substrate 160, which has a mounting surface 162. The mounting surface 162 of the second substrate 160 is coupled to the second surface 124 of the spacer structure 120. In some embodiments, the second substrate 160 includes a material that is transparent to light emitted by the at least one light-emitter device 130.

The optical system 100 further includes at least one lens 164 coupled to the mounting surface 162 of the second substrate 160. In some embodiments, the at least one lens 164 could be a cylindrical lens. In such scenarios, the cylindrical lens may be configured to collimate light emitted by the at least one light-emitter device 130. For example, the cylindrical lens could provide fast-axis collimation of light emitted from the at least one light-emitter device 130. Furthermore, in some embodiments, the cylindrical lens could include one or more optical fibers.

In some embodiments, the at least one lens 164 could include materials such as glass (silica), polycarbonate, polyethylene, fluoride, chalcogenides, and/or other optical materials. In an example embodiment, the at least one lens 164 could be utilized to focus, defocus, direct, and/or otherwise couple the emitted light into at least one waveguide 166. In some embodiments, the at least one lens 164 could be approximately 100-200 microns in diameter. However, other diameters are possible and contemplated. In addition, lenses that are in other shapes could be used instead of, or in addition to, the at least one lens 164.

In some embodiments, the at least one lens 164 could be coupled to the mounting surface 162 with epoxy or another type of adhesive. Additionally or alternatively, the at least one lens 164 could be disposed between at least one pair of three-dimensional alignment structures. In such scenarios, the at least one pair of three-dimensional alignment structures could be configured to secure the at least one lens 164 to a predetermined location.

The optical system 100 also includes at least one waveguide 166 coupled to the mounting surface 162 of the second substrate 160. The at least one light-emitter device 130 is configured to emit light toward the at least one lens 164 such that at least a portion of the emitted light is optically coupled into the at least one waveguide 166 as optically-coupled light.

For example, the at least one waveguide 166 could be configured to efficiently guide light along a propagation direction. For example, the at least one waveguide 166 may be configured to couple light emitted from the at least one light-emitter device 130. At least a portion of such light may be guided within at least a portion of the at least one waveguide 166 via total internal reflection and/or evanescent optical coupling.

In some embodiments, the at least one waveguide 166 includes at least one reflective surface. In such scenarios, at least a portion of the optically-coupled light could interact with the at least one reflective surface so as to be directed toward an external environment. For example, the at least one waveguide 166 may include one or more reflective surfaces (e.g., mirrored facets) configured to direct light normal to the propagation direction. In such a scenario, at least a portion of the light may be coupled out of the at least one waveguide 166 via a mirrored facet.

In some scenarios, the at least one waveguide 166 could be formed from a polymeric material, such as photoresist. For example, the polymeric material may include SU-8 polymer, Kloe K-CL negative photoresist, Dow PHO-TOPOSIT negative photoresist, or JSR negative tone THB photoresist. It will be understood that the at least one waveguide 166 may be formed from other polymeric photo-patternable materials. The at least one waveguide 166 could be a photo-patterned material layer that is 100-120 microns thick. However, the at least one waveguide 166 could alternatively have a different thickness.

In some embodiments, the at least one detector device 140 is configured to receive light from the external environment via the second substrate 160, the at least one waveguide 166, and the at least one aperture 152. In other words, light from the external environment could pass through the substantially transparent second substrate 160 and at least one waveguide 166 as well as through an opening defined by the at least one aperture 152 and into the at least one cavity 126 to the at least one detector device 140.

In some embodiments, optical system 100 could also include a shim 170, which could be coupled between the second surface 124 of the spacer structure 120 and the mounting surface 162 of the second substrate 160.

In example embodiments, the optical system 100 additionally includes a circuit board 190. In such scenarios, the circuit board 190 could be coupled to a surface of the first substrate 110 by way of a plurality of controlled-collapse solder balls 180.

In some embodiments, the optical system 100 could include one or more pulser circuits 132 configured to control the at least one light-emitter device 130. For instance, in some embodiments, the one or more pulser circuits 132 could be disposed on the second surface 124 of the spacer structure 120. In other embodiments, the one or more pulser circuits 132 could be located elsewhere. Additionally or alternatively, the at least one light-emitter device 130 could be electrically-coupled to the one or more pulser circuits 132 by way of one or more wire bonds.

Figure 2:
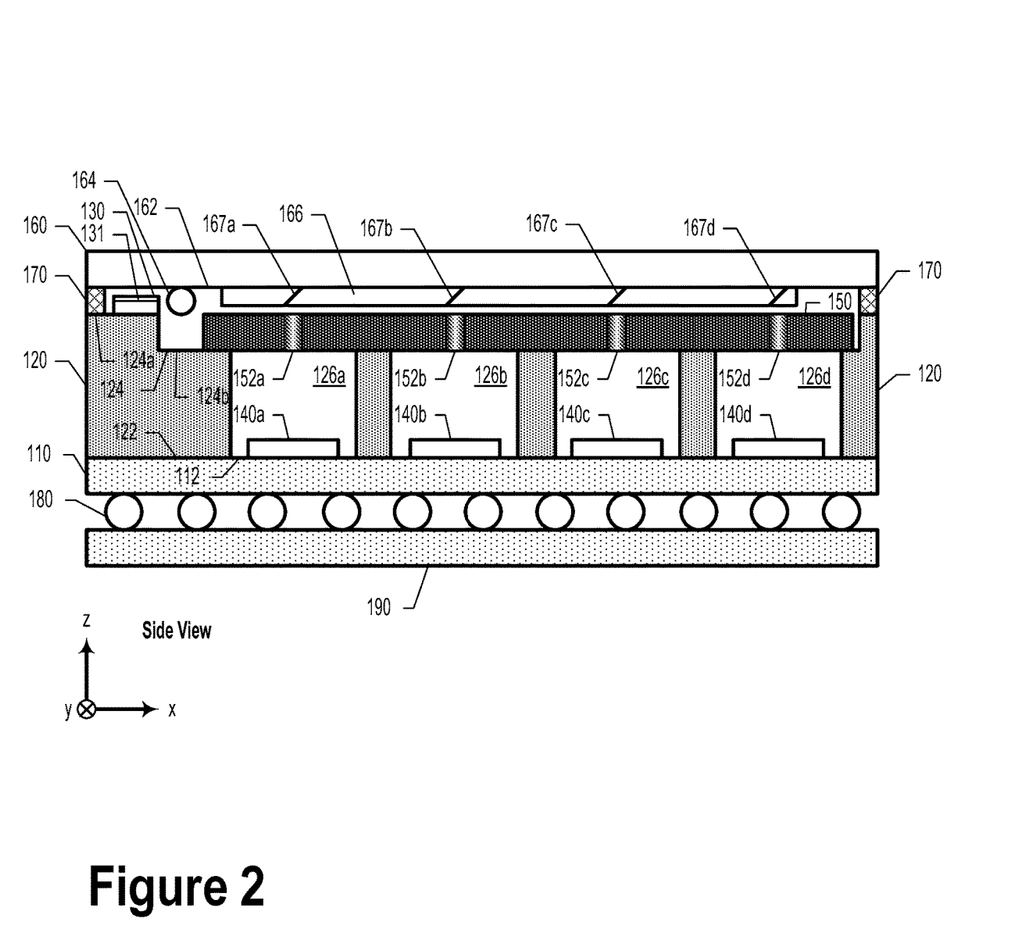
FIG. 2 illustrates a cross-sectional view of an optical system, according to an example embodiment.

FIG. 2 illustrates a cross-sectional view 200 of the optical system 100, according to an example embodiment. FIG. 2 could include elements that are similar or identical to those of optical system 100 illustrated and described in reference to FIG. 1.

For example, in some embodiments, the optical system 100 could include a first substrate 110 having a mounting surface 112. The optical system 100 could include a spacer structure 120 having a first surface 122 and a second surface 124. The spacer structure 120 could include one or more cavities 126a-126d.

One or more light-emitter devices 130 could be coupled to the second surface 124 of the spacer structure 120. The light-emitter devices 130 could each include one or more light-emitting regions 131. As illustrated in FIG. 2, the second surface 124 could include an upper surface 124a and a lower surface 124b. For example, the upper surface 124a could define a first plane and the lower surface 124b could define a second plane. That is, in some embodiments, the second surface 124 could include an upper surface 124a that "steps down" to a lower surface 124b.

In some embodiments, detector devices 140a-140d could be disposed within the one or more cavities 126a-126d. For example, as illustrated, each cavity could include one detector device. However alternatively, multiple detector devices and/or detector arrays could be disposed in a single cavity. The detector devices 140a-140d could be configured to detect the light emitted by the one or more light-emitter devices 130 after interaction with the external environment.

As additionally illustrated in FIG. 2, an intermediate lid 150 could be coupled to the second surface 124 (e.g., the lower surface 124b) of the spacer structure 120. In embodiments, the intermediate lid 150 could include a plurality of apertures 152a-152d, which could be disposed adjacent to the cavities 126a-126d. In some embodiments, the apertures 152a-152d could have a diameter of 150 microns. However, other aperture diameters are possible and contemplated.

In some embodiments, the plurality of apertures 152a-152d could include holes drilled or lithographically etched through a material that is substantially opaque to light emitted by the light-emitter devices 130. In other embodiments, the plurality of apertures 152a-152d could include optical windows that are substantially transparent to light emitted by the light-emitter devices 130.

While FIG. 2 illustrates the intermediate lid 150 as including the plurality of apertures 152a-152d, it will be understood that in some embodiments, the plurality of apertures 152a-152d could be formed in the spacer structure 120. For example, the spacer structure 120 could include one or more holes forming the plurality of apertures 152a-152d. In one example embodiment, plurality of apertures 152a-152d could be formed between the upper surface 124a and the lower surface 124b of the spacer structure 120.

FIG. 2 also illustrates a second substrate 160 that includes a mounting surface 162. In some embodiments, the second substrate 160 could be substantially transparent to light emitted by light-emitter device 130. At least one lens 164 could be coupled to the mounting surface 162 of the second substrate 160. Furthermore, at least one waveguide 166 is coupled to the mounting surface 162 of the second substrate 160. In embodiments, the at least one waveguide 166 could include reflective surfaces 167a-167d (e.g., mirrored facets).

In examples, a shim 170 could be disposed between a second surface 124 of the spacer structure 120 and the mounting surface 162 of the second substrate 160. In some embodiments, the shim 170 could be selected such that a light-emitting region 131 is disposed at a predetermined or desired position with respect to the at least one lens 164 and/or the at least one waveguide 166. For example, the shim 170 could be selected so that light emitted from the light-emitting region 131 is efficiently collected by the at least one lens 164 and efficiently optically-coupled into the at least one waveguide 166.

While FIG. 2 illustrates shim 170 as being located near the sides of the optical system 100, it will be understood that the shim 170 could be located elsewhere. For example, shim 170 could be disposed between the intermediate lid 150 and the mounting surface 162 of the second substrate 160. Additionally or alternatively, shim 170 could be present in other regions of the optical system 100, for example, to provide a baffle (e.g., to prevent stray light).

The optical system 100 could additionally include a circuit board 190 that could be physically coupled to the first substrate 110 by way of controlled-collapse solder balls 180. Other ways to physically and/or electrically connect the first substrate 110 to the circuit board 190 are possible and contemplated, such as, without limitation, conventional solder balls, ball-grid arrays (BGA), land-grid arrays (LGA), conductive paste, and other types of physical and electrical sockets.

III. Example Methods

FIGS. 3A-3G illustrate various steps of a method of manufacture, according to one or more example embodiments. It will be understood that at least some of the various steps may be carried out in a different order than of that presented herein. Furthermore, steps may be added, subtracted, transposed, and/or repeated. FIGS. 3A-3G may serve as example illustrations for at least some of the steps or blocks described in relation to method 400 as illustrated and described in relation to FIG. 4. Additionally, some steps of FIGS. 3A-3G may be carried out so as to provide optical system 100, as illustrated and described in reference to FIGS. 1 and 2.

Figure 3A:
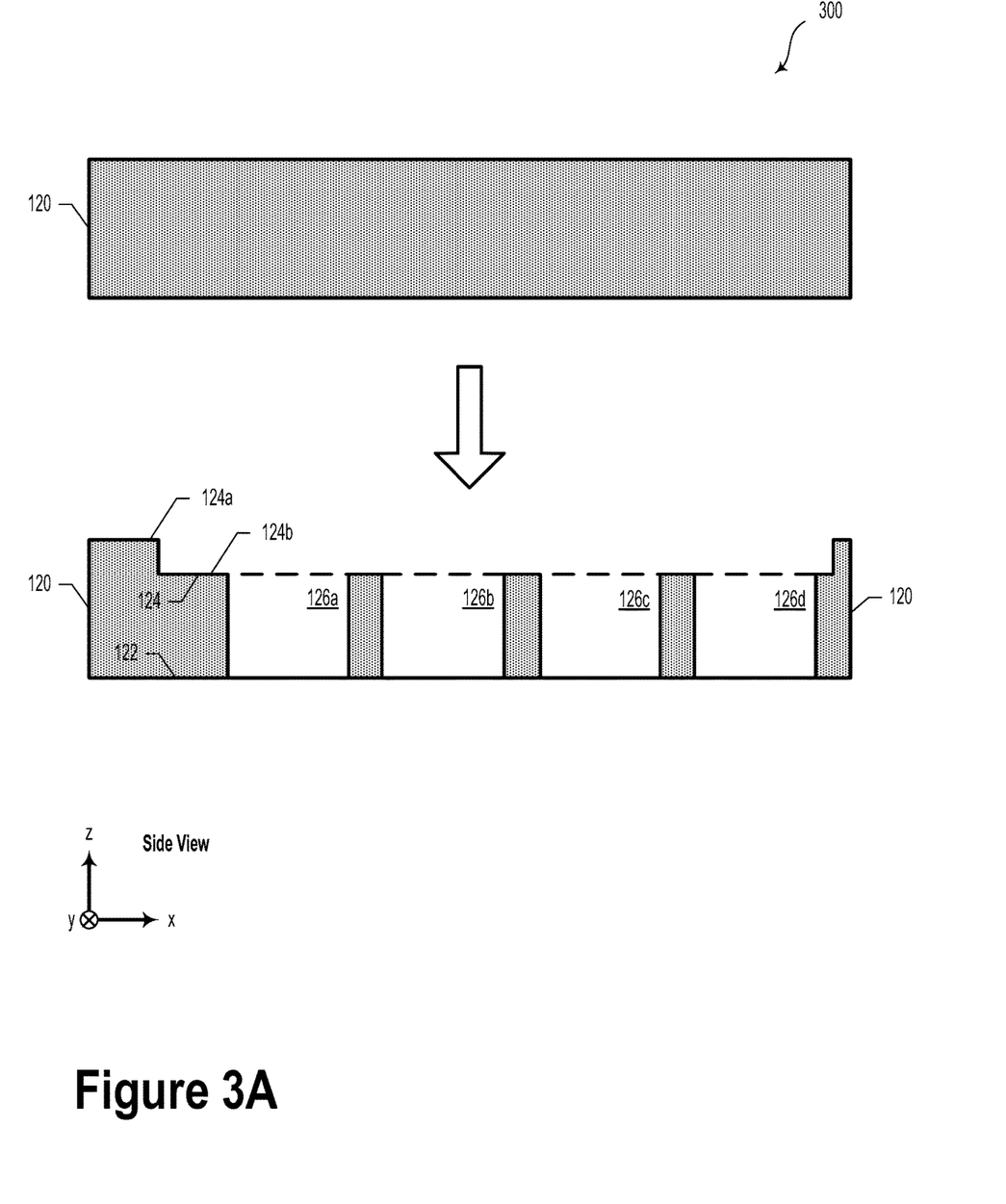
FIG. 3A illustrates a step of a method of manufacture, according to an example embodiment.

FIG. 3A illustrates a step of a method of manufacture 300, according to an example embodiment. Step 300 initially includes providing a spacer structure 120. The spacer structure 120 could include a semiconductor material and/or a polymeric material. Subsequently, using one or more techniques, at least one cavity (e.g., cavities 126a-126d) could be formed in the spacer structure 120. That is, a first surface 122 of the spacer structure 120 could have an opening forming part of the at least one cavity and a second surface 124 of the spacer structure 120 could have an opening forming part of the at least one cavity. In some embodiments, the cavities 126a-126d could be formed by removing at least a portion of the spacer structure 120 using semiconductor manufacturing methods such as dry or wet etching processes. Other ways to form the cavities in the spacer structure 120 are contemplated.

In some embodiments, the formed spacer structure 120 could include various step or shelf-like structures that define various levels along the second surface 124 of the spacer structure 120. In other words, the second surface 124 could define two or more substantially parallel planes having different z-values. In other embodiments, the second surface 124 could define a single, common plane.

Figure 3B:
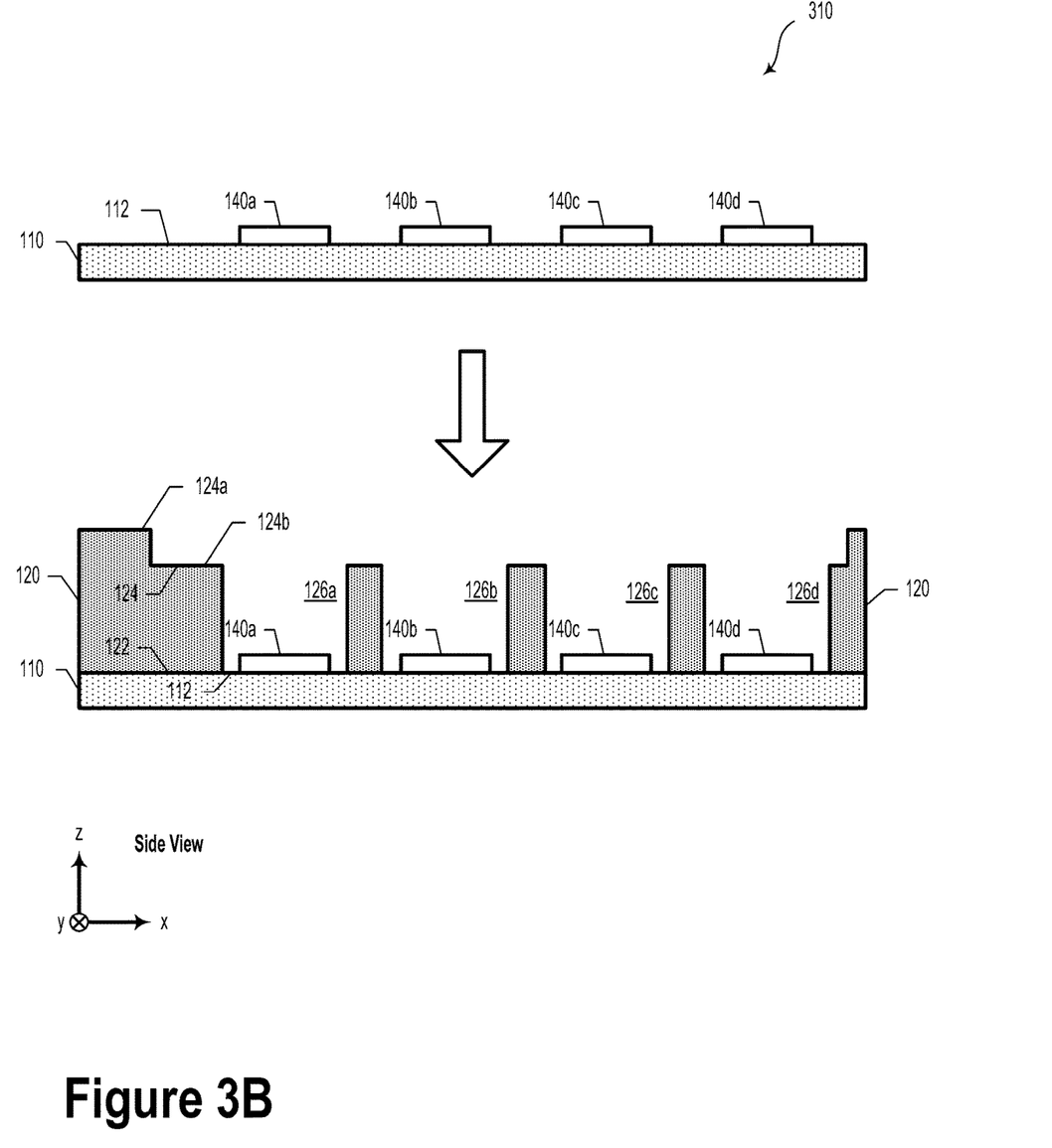
FIG. 3B illustrates a step of a method of manufacture, according to an example embodiment.

FIG. 3B illustrates a step of a method of manufacture 310, according to an example embodiment. Step 310 includes coupling at least one detector device (e.g., detector devices 140a-140d) to a mounting surface 112 of a first substrate 110. The detector devices could be mounted to the mounting surface 112 using a pick and place tool and/or an adhesive material. In some embodiments, the detector devices could be mounted to the mounting surface 112 in an aligned fashion so as to be within respective cavities 126a-126d of the spacer structure 120.

In some embodiments, the first substrate 110 could include a semiconductor material (e.g., silicon, gallium arsenide, etc.). In other embodiments, the first substrate 110 could include other materials.

As described herein, the detector devices could include silicon photomultiplier (SiPM) devices and/or avalanche photodiodes (APDs). Other types of photo-sensitive detector devices are possible.

Step 310 also includes coupling the mounting surface 112 of the first substrate 110 to the first surface 122 of the spacer structure 120 such that the at least one detector device (e.g., detector devices 140a-140d) is disposed within the at least one cavity (e.g., cavities 126a-126d) of the spacer structure 120.

Figure 3C:
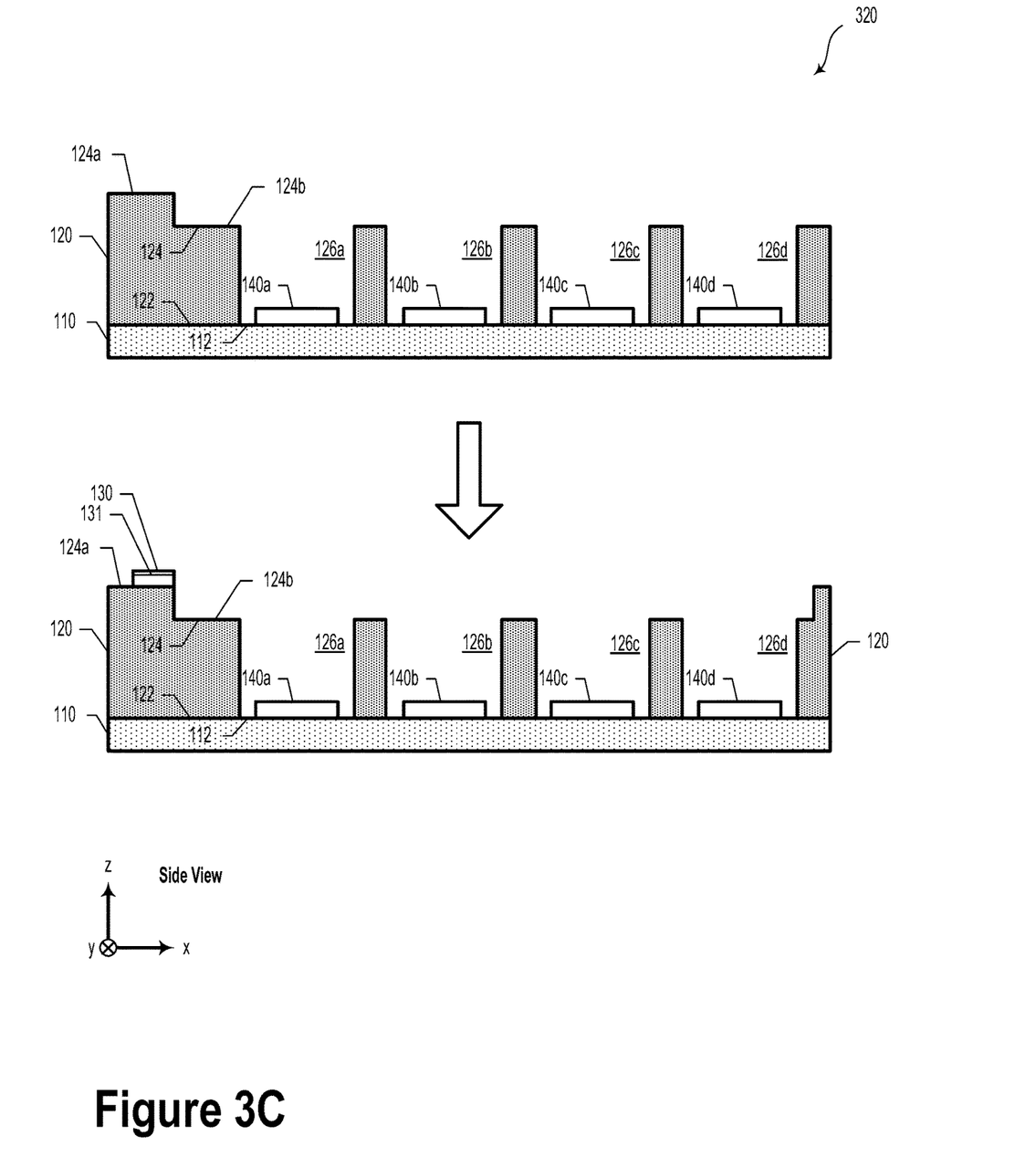
FIG. 3C illustrates a step of a method of manufacture, according to an example embodiment.

FIG. 3C illustrates a step of a method of manufacture 320, according to an example embodiment. Step 320 includes coupling at least one light-emitter device 130 to the second surface 124 of the spacer structure 120. The at least one light-emitter device 130 could include an InGaAs laser diode. However, other types of light-emitter devices are contemplated and possible. In some embodiments, a plurality of light-emitter devices 130 could be disposed along an axis extending "into the page" as illustrated (e.g., along the y-axis). The light-emitter devices 130 could include a light-emitting region 131, which could include a location of a laser bar and/or a light-emitting diode region.

In some embodiments, the light-emitter device 130 could be coupled to the second surface 124 of the spacer structure 120 by way of an adhesive, such as a conductive epoxy. However, other types of materials configured to fix the light-emitter device 130 to the second surface 124 are possible and contemplated. In some embodiments, the light-emitter device 130 could be positioned along a "shelf" or step along the second surface 124 of the spacer structure 120. However, in some embodiments, the second surface 124 could be planar (e.g., with respect to upper surface 124a. That is, in such scenarios, the intermediate lid 150 and the plurality of apertures 152a-152d could be replaced by the spacer structure 120, which could include a plurality of holes that form the plurality of apertures 152a-152d.

Figure 3D:
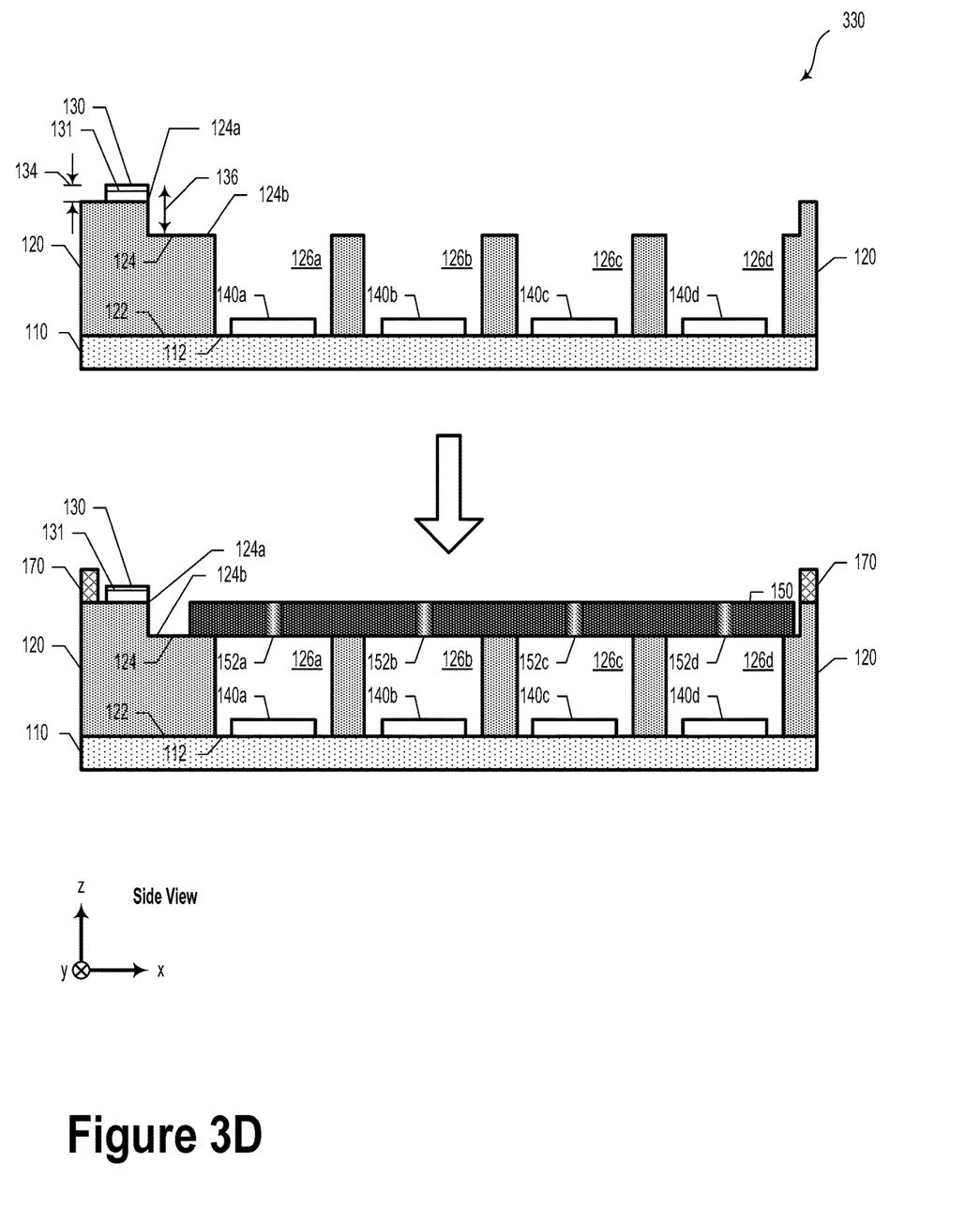
FIG. 3D illustrates a step of a method of manufacture, according to an example embodiment.

FIG. 3D illustrates a step of a method of manufacture 330, according to an example embodiment. Step 330 includes determining a step height (e.g., step height 134 or step height 136) between a surface (e.g., a top surface) of the at least one light-emitter device 130 and the second surface 124 of the spacer structure 120. As described herein, determining the step height could include using a contact or non-contact profilimetry system or another type of imaging system.

Based on the determined step height, step 330 could include selecting a shim. The selected shim could, for example, provide a desired vertical offset for the second substrate 160 and its associated components (e.g., at least one lens 164 and at least one waveguide 166). In other words, the selected shim could help to position the second substrate 160 along the z-axis so as to align or position the light-emitter device 130 with the at least one lens 164 and/or the at least one waveguide 166. Step 330 could additionally include coupling the shim 170 to the second surface 124 of the spacer structure 120. As described herein, the shim 170 could include a polymer material that cures or molds around the top lid. As such, the shim 170 could fix or hold the second substrate 160 at a fixed height and/or location relative to the spacer structure 120 and other elements of the optical system 100.

In some embodiments, step 330 could include coupling an intermediate lid 150 to the second surface 124 of the spacer structure 120. In such scenarios, the intermediate lid 150 includes at least one aperture (e.g., apertures 152a-152d) that defines an optical path to the at least one detector device (e.g., detector devices 140a-140d) through the at least one cavity (e.g., cavities 126a-126d) of the spacer structure 120.

Figure 3E:
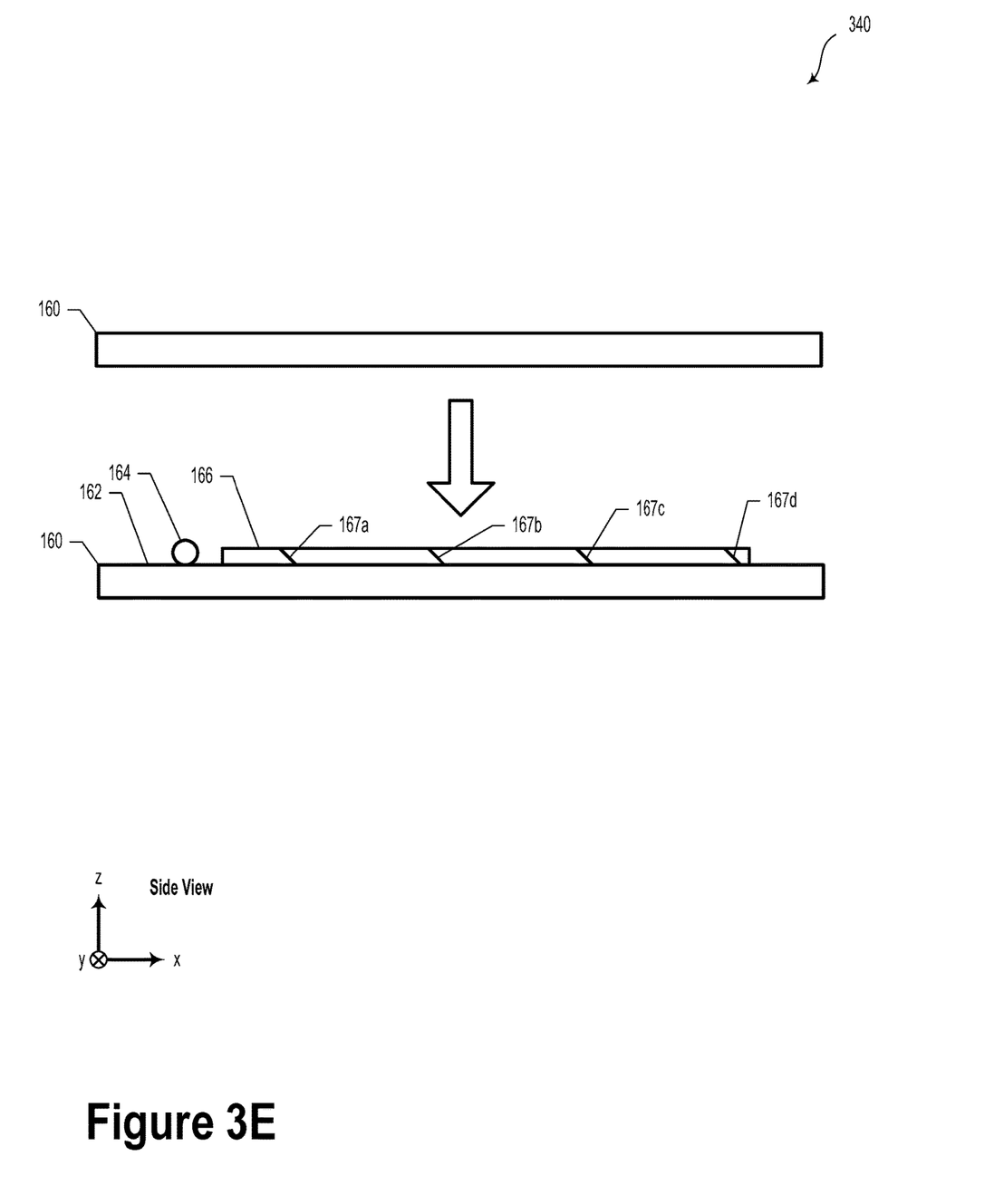
FIG. 3E illustrates a step of a method of manufacture, according to an example embodiment.

FIG. 3E illustrates a step of a method of manufacture 340, according to an example embodiment. Step 340 includes coupling at least one lens 164 and at least one waveguide 166 to a mounting surface 162 of a second substrate 160. In some embodiments, the waveguide 166 could include one or more reflective surfaces or mirror facets (e.g., reflective surfaces 167a-167d). In some embodiments, the at least one lens 164 could be placed using a pick and place system and fixed in place with three-dimensional alignment structures and/or an adhesive material. The alignment structures could be defined using photolithography. For example, the alignment structures could be formed with a photo-definable material. In yet other embodiments, the at least one lens 164 could be maintained in position by a downward force applied by a clamping surface.

In examples, the at least one waveguide 166 could be formed with photolithography and other semiconductor manufacturing techniques. The at least one waveguide 166 could be formed from glass, photoresist, SU-8, or another polymeric material. In some embodiments, the reflective surfaces 167a-167d could be formed using angled photolithography. The reflective surfaces 167a-167d could be coated with a reflective material, such as aluminum. However, other materials are possible and contemplated. In an alternative embodiment, the at least one waveguide 166 could alternatively be formed through embossing, micro injection molding, machining, UV molding, laser etching, or 3D printing, among other possibilities. Furthermore, in some embodiments, the reflective surfaces 167a-167d could redirect the light entirely through total internal reflection without the need for a reflective metal layer.

Figure 3F:
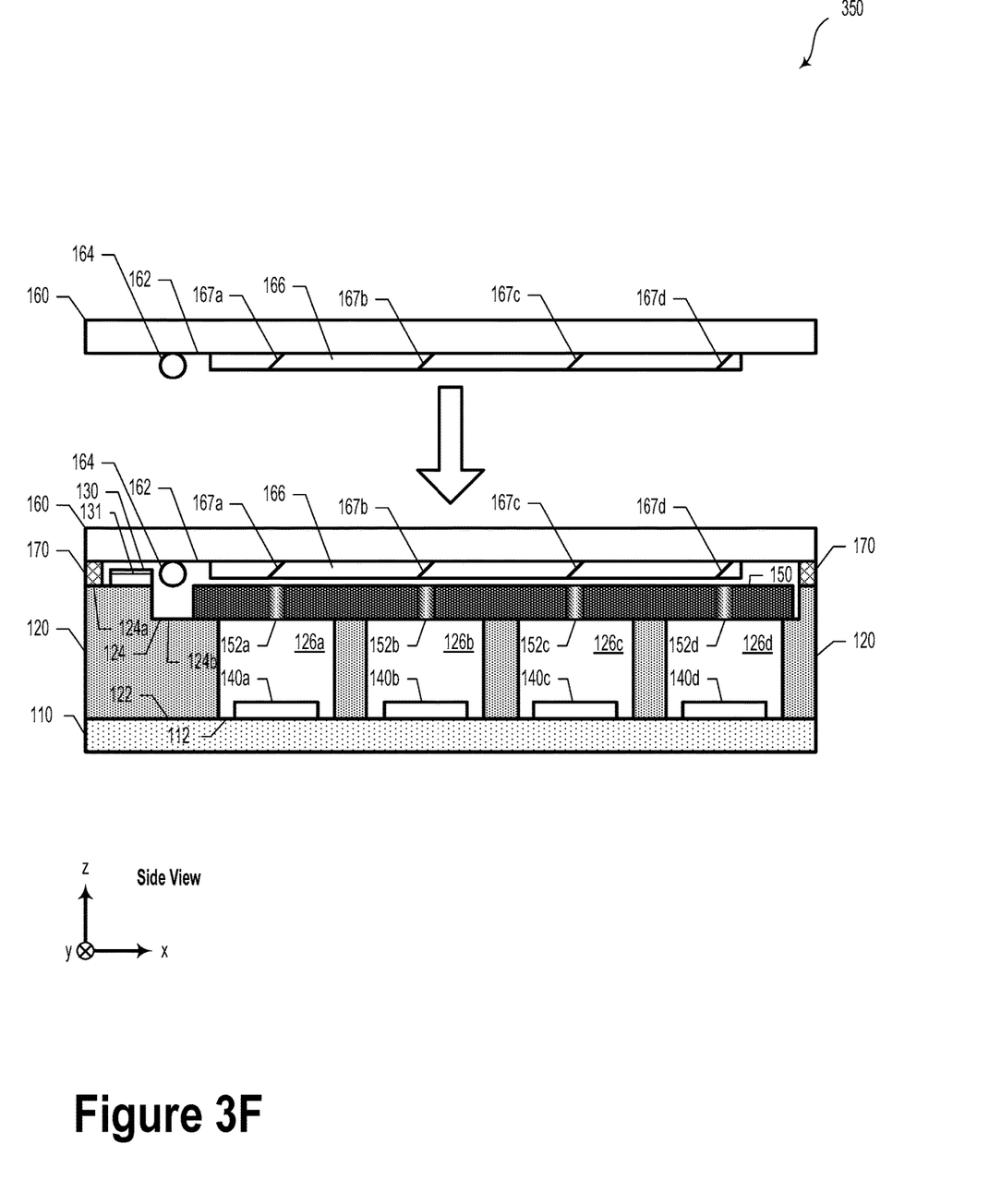
FIG. 3F illustrates a step of a method of manufacture, according to an example embodiment.

FIG. 3F illustrates a step of a method of manufacture 350, according to an example embodiment. Step 350 includes coupling the mounting surface 162 of the second substrate 160 to the second surface 124 of the spacer structure 120 by way of the selected shim 170. In some embodiments, step 350 could include aligning one or more of the elements with respect to one or more reference marks. Furthermore, coupling the mounting surface 162 of the second substrate 160 to the second surface 124 of the spacer structure 120 by way of the selected shim 170 could include applying an adhesive material to an interface between the mounting surface 162 and the shim 170 and/or between the second surface 124 and the shim 170.

Upon coupling the mounting surface 162 of the second substrate 160 to the second surface 124 of the spacer structure 120 by way of the selected shim 170, the light-emitting region 131 of the light-emitter device 130 could be substantially aligned with the at least one lens 164 and/or the at least one waveguide 166.

Figure 3G:
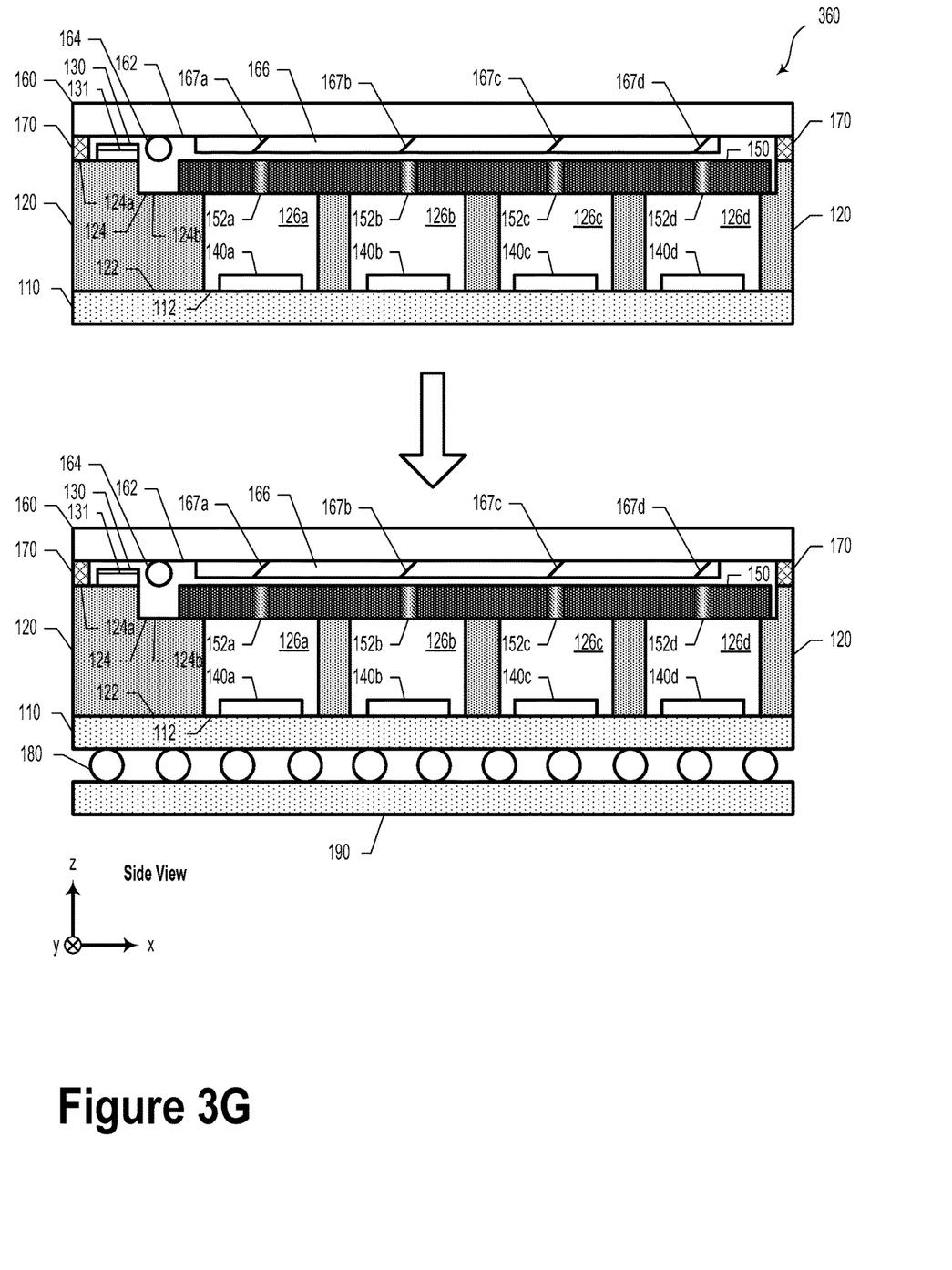
FIG. 3G illustrates a step of a method of manufacture, according to an example embodiment.

FIG. 3G illustrates a step of a method of manufacture 360, according to an example embodiment. Step 360 includes coupling a circuit board 190 to a surface of the first substrate 110 by way of a plurality of controlled-collapse solder balls 180. As an example, the circuit board 190 could include some or all of the control circuitry operable to control the various functions of the optical system 100. In some embodiments, the circuit board 190 could include a read-out integrated circuit (ROIC), a pulser circuit, or other types of circuits.

Figure 4:
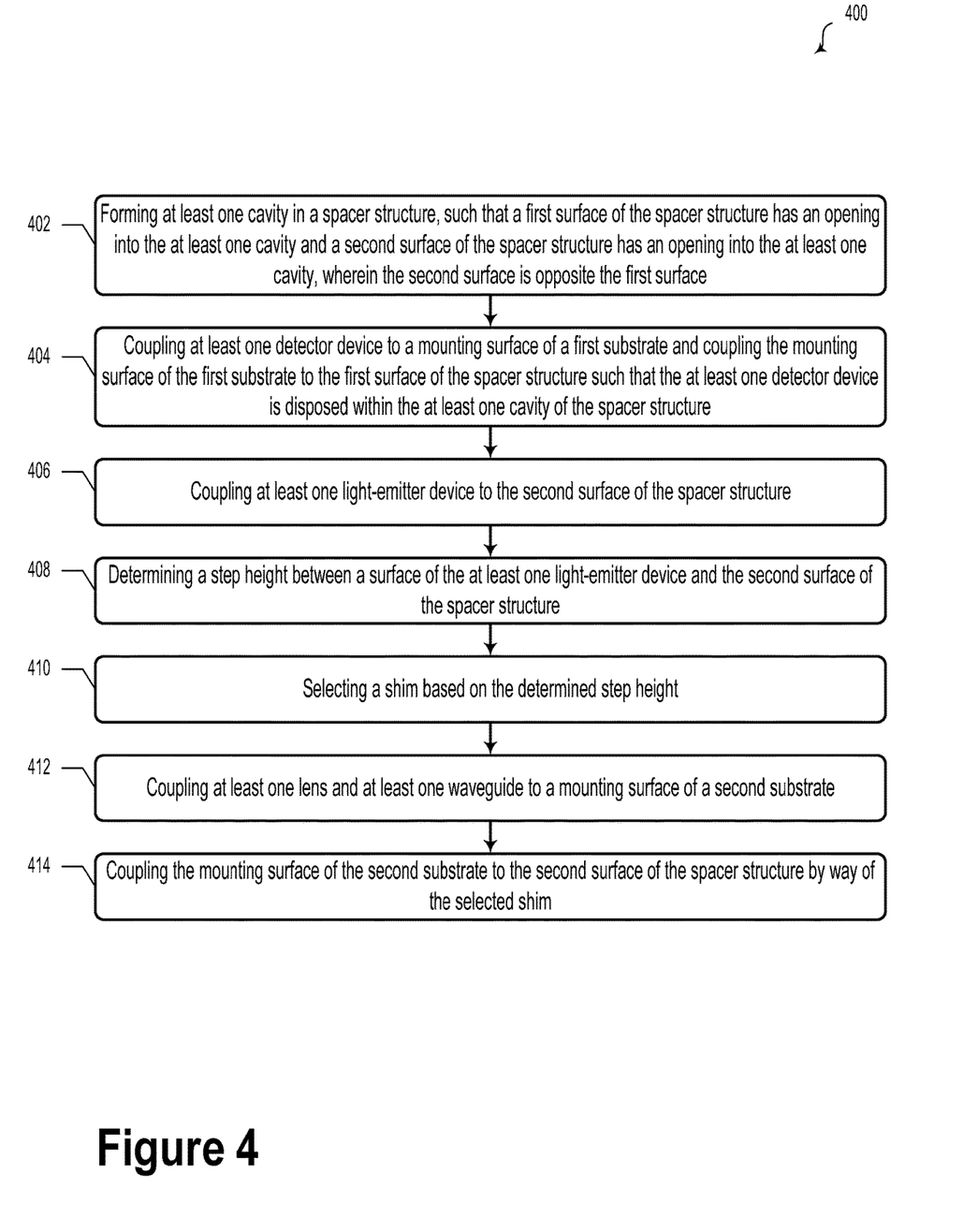
FIG. 4 illustrates a method, according to an example embodiment.

FIG. 4 illustrates a method 400, according to an example embodiment. Method 400 may be carried out, at least in part, by way of some or all of the manufacturing steps or stages illustrated and described in reference to FIGS. 3A-3G. It will be understood that the method 400 may include fewer or more steps or blocks than those expressly disclosed herein. Furthermore, respective steps or blocks of method 400 may be performed in any order and each step or block may be performed one or more times. In some embodiments, method 400 and its steps or blocks may be performed to provide an optical system that could be similar or identical to optical system 100, as illustrated and described in reference to FIGS. 1 and 2.

Block 402 includes forming at least one cavity in a spacer structure, the spacer structure having a first surface opposite a second surface.

In some embodiments, forming the at least one cavity in the spacer structure could include lithographically-defining at least one of the opening in the first surface or the opening in the second surface. For example, the openings could be defined using photoresist, which may function as an etch stop. Thereafter, the at least one cavity could be formed by way of a wet or dry etch process that removes or etches portions of the spacer structure. For example, the at least one cavity could be formed by utilizing an anisotropic dry etch. Other ways to form the at least one cavity are contemplated and possible.

Block 404 includes coupling at least one detector device to a mounting surface of a first substrate. In some embodiments, coupling the at least one detector device to the mounting surface could include applying a conductive epoxy at an interface between the at least one detector device and the mounting surface. Alternatively or additionally, the at least one detector could be wire bonded to one or more electrical pads disposed on the mounting surface.

Block 404 also includes coupling the mounting surface of the first substrate to the first surface of the spacer structure such that the at least one detector device is disposed within the at least one cavity of the spacer structure. In some embodiments, coupling the first substrate to the spacer structure could include application of one or more adhesive materials (e.g., epoxy). Additionally or alternatively, a wafer bonding technique could be utilized.

Block 406 includes coupling at least one light-emitter device to the second surface of the spacer structure. In examples, coupling the at least one light-emitter device to the second surface could include applying a conductive adhesive material to an interface between the light-emitter device(s) and the second surface. Other ways to couple the at least one light-emitter device to the second surface of the spacer structure are possible and contemplated.

Block 408 includes determining a step height between a surface of the at least one light-emitter device and the second surface of the spacer structure. In some embodiments, the step height could include a distance between the upper surface 124a and a top surface of the light-emitter device 130. However, the step height could be another distance that could be used as a registration surface and/or location reference for the one or more light-emitting regions 131. Determining the step height could include utilizing, for example, a contact profilometer, a non-contact profilometer (e.g., a Veeco Wyco system), an optical microscope, a scanning electron microscope, or another system configured to provide accurate step height measurements with an uncertainty or error of less than 1-10 microns. Other ways to determine the step height of the light-emitter device(s) are possible and contemplated.

Block 410 includes selecting a shim based on the determined step height. In such scenarios, the selected shim could be selected such that, upon coupling the second substrate to the spacer structure, a respective laser diode region of the at least one light-emitter device is positioned at a predetermined and/or desired location with respect to the at least one lens. In some embodiments, the alignment of the light-emitter device with respect to the lens (or vice versa) could be performed by utilizing an external jig, a fixture, and/or a robot. For example, the alignment could be performed with a closed-loop control system using light emitted from the light-emitter device. In such a scenario, the laser light could be coupled into the waveguide and emitted from the reflective surfaces and received by an alignment detector. As such, the closed-loop control system could adjust the relative position of the light-emitter device and the lens based on the light received at the alignment detector. For example, the closed-loop control system could be operable to adjust the relative position of the light-emitter device and the lens so as to maximize an intensity of the received light.

Block 412 includes coupling at least one lens and at least one waveguide to a mounting surface of a second substrate. In some scenarios, the at least one lens could include a cylindrical lens that is configured to collimate light emitted by the at least one light-emitter device. In some embodiments, the cylindrical lens could be an optical fiber.

Block 414 includes coupling the mounting surface of the second substrate to the second surface of the spacer structure by way of the selected shim. In some embodiments, some or all of the coupling steps of method 400 may include applying an adhesive material to at least one elements being coupled, and/or an interface between the elements being coupled. For example, various blocks could include application of the adhesive material to the mounting surface of the first substrate, the first surface of the spacer structure, the second surface of the spacer structure, the shim, or the mounting surface of the second substrate. In embodiments, the adhesive material could include a conductive or non-conductive epoxy. Other adhesive materials are possible and contemplated. In some embodiments, some of the coupling steps of method 400 could include other types of material bonding, such as wafer bonding techniques, fastener-assisted bonding, etc.

In some scenarios, coupling various elements together could include applying an adhesive material to one or both of the elements and applying a predetermined contact force (e.g., 1-100 N, or more) that could be maintained during a curing or drying period.

Additionally or alternatively, method 400 could include coupling an intermediate lid to the second surface of the spacer structure. In such scenarios, the intermediate lid could include at least one aperture that defines an optical path to the at least one detector device through the at least one cavity of the spacer structure.

In some embodiments, the spacer structure could include at least one alignment feature. In such scenarios, method 400 could further include aligning the second substrate to the spacer structure according to the at least one alignment feature. For example, the second substrate could include at least one portion that is transparent (or completely removed) so as to provide an alignment window for aligning the second substrate with the spacer structure. Other types of alignment (e.g., edge to edge alignment) are possible and contemplated.

In examples, method 400 could additionally or alternatively include coupling a circuit board to a surface of the first substrate by way of a plurality of controlled-collapse solder balls.

Yet further, method 400 could also include forming at least one reflective facet in the at least one waveguide.

Optionally, method 400 could include coupling at least one pulser circuit to the spacer structure and electrically connecting the at least one pulser circuit to the at least one detector device.

The particular arrangements shown in the Figures should not be viewed as limiting. It should be understood that other embodiments may include more or less of each element shown in a given Figure. Further, some of the illustrated elements may be combined or omitted. Yet further, an illustrative embodiment may include elements that are not illustrated in the Figures.

A step or block that represents a processing of information can correspond to circuitry that can be configured to perform the specific logical functions of a herein-described method or technique. Alternatively or additionally, a step or block that represents a processing of information can correspond to a module, a segment, a physical computer (e.g., a field programmable gate array (FPGA) or application-specific integrated circuit (ASIC)), or a portion of program code (including related data). The program code can include one or more instructions executable by a processor for implementing specific logical functions or actions in the method or technique. The program code and/or related data can be stored on any type of computer readable medium such as a storage device including a disk, hard drive, or other storage medium.

The computer readable medium can also include non-transitory computer readable media such as computer-readable media that store data for short periods of time like register memory, processor cache, and random access memory (RAM). The computer readable media can also include non-transitory computer readable media that store program code and/or data for longer periods of time. Thus, the computer readable media may include secondary or persistent long term storage, like read only memory (ROM), optical or magnetic disks, compact-disc read only memory (CD-ROM), for example. The computer readable media can also be any other volatile or non-volatile storage systems. A computer readable medium can be considered a computer readable storage medium, for example, or a tangible storage device.

While various examples and embodiments have been disclosed, other examples and embodiments will be apparent to those skilled in the art. The various disclosed examples and embodiments are for purposes of illustration and are not intended to be limiting, with the true scope being indicated by the following claims.

What is claimed is:

1. An optical system comprising:
    a first substrate;
    a spacer structure, wherein the spacer structure comprises at least one cavity, wherein the spacer structure is coupled to the first substrate;
    at least one light-emitter device, wherein the at least one light-emitter device is coupled to the spacer structure;
    at least one detector device, wherein the at least one detector device is coupled to the first substrate such that the at least one detector device is disposed within the at least one cavity of the spacer structure;
    a second substrate, coupled to the spacer structure;
    at least one lens coupled to the second substrate; and
    at least one waveguide coupled to the second substrate, wherein the at least one light-emitter device is configured to emit light toward the at least one lens such that at least a portion of the emitted light is optically coupled into the at least one waveguide as optically-coupled light.

2. The optical system of claim 1, further comprising an intermediate lid, wherein the intermediate lid is coupled to the spacer structure, wherein the intermediate lid comprises at least one aperture that defines an optical path to the at least one detector device through the at least one cavity of the spacer structure.

3. The optical system of claim 2, wherein the at least one detector device is configured to receive light from an external environment via the at least one aperture.

4. The optical system of claim 1, wherein the at least one waveguide comprises at least one reflective surface, and wherein at least a portion of the optically-coupled light interacts with the reflective surface so as to be directed toward an external environment.

5. The optical system of claim 1, wherein the second substrate comprises a material that is transparent to light emitted by the at least one light-emitter device.

6. The optical system of claim 1, further comprising a circuit board, wherein the circuit board is coupled to a surface of the first substrate by way of a plurality of controlled-collapse solder balls.

7. The optical system of claim 1, wherein the at least one lens comprises a cylindrical lens, wherein the cylindrical lens is configured to collimate light emitted by the at least one light-emitter device.

8. The optical system of claim 7, wherein the cylindrical lens comprises an optical fiber.

9. The optical system of claim 1, further comprising one or more pulser circuits configured to control the at least one light-emitter device, wherein the one or more pulser circuits are disposed on the spacer structure, and wherein the at least one light-emitter device is electrically coupled to the one or more pulser circuits by way of one or more wire bonds.

10. A method comprising:
forming at least one cavity in a spacer structure;
coupling at least one detector device to a first substrate and coupling the first substrate to the spacer structure such that the at least one detector device is disposed within the at least one cavity of the spacer structure;
coupling at least one light-emitter device to the spacer structure;
determining a step height between a surface of the at least one light-emitter device and the spacer structure;
selecting a shim based on the determined step height;
coupling at least one lens and at least one waveguide to a second substrate; and
coupling the second substrate to the spacer structure by way of the selected shim.

11. The method of claim 10, further comprising:
applying an adhesive material to at least one of the first substrate, a surface of the spacer structure, the shim, or the second substrate.

12. The method of claim 10, further comprising:
coupling an intermediate lid to the spacer structure, wherein the intermediate lid comprises at least one aperture that defines an optical path to the at least one detector device through the at least one cavity of the spacer structure.

13. The method of claim 10, wherein the spacer structure comprises at least one alignment feature, wherein the method further comprises aligning the second substrate to the spacer structure according to the at least one alignment feature.

14. The method of claim 10, further comprising:
coupling a circuit board to a surface of the first substrate by way of a plurality of controlled-collapse solder balls.

15. The method of claim 10, further comprising forming at least one reflective facet in the at least one waveguide.

16. The method of claim 10, wherein the selected shim is selected such that, upon coupling the second substrate to the spacer structure, a respective laser diode region of the at least one light-emitter device is positioned at a desired location with respect to the at least one lens.

17. The method of claim 10, wherein the at least one lens comprises a cylindrical lens, wherein the cylindrical lens is configured to collimate light emitted by the at least one light-emitter device.

18. The method of claim 17, wherein the cylindrical lens comprises an optical fiber.

19. The method of claim 10, further comprising:
coupling at least one pulser circuit to the spacer structure; and
electrically connecting the at least one pulser circuit to the at least one detector device.

* * * * *